US012635290B2

(12) United States Patent
Sasaki et al.

(10) Patent No.: US 12,635,290 B2
(45) Date of Patent: May 19, 2026

(54) LIGHT-EMITTING ELEMENT AND METHOD OF MANUFACTURING THE SAME

(71) Applicant: DOWA Electronics Materials Co., Ltd., Tokyo (JP)

(72) Inventors: Shiori Sasaki, Joetsu (JP); Yoshitaka Kadowaki, Akita (JP)

(73) Assignee: DOWA Electronics Materials Co., Ltd., Tokyo (JP)

( * ) Notice: Subject to any disclaimer, the term of this patent is extended or adjusted under 35 U.S.C. 154(b) by 386 days.

(21) Appl. No.: 18/403,717

(22) Filed: Jan. 4, 2024

(65) Prior Publication Data

US 2024/0234625 A1 Jul. 11, 2024

(30) Foreign Application Priority Data

Jan. 10, 2023 (JP) .................................. 2023-002002

(51) Int. Cl.
| | |
|---|---|
| *H10H 20/824* | (2025.01) |
| *H10H 20/01* | (2025.01) |
| *H10H 20/81* | (2025.01) |
| *H10H 20/812* | (2025.01) |
| *H10H 20/816* | (2025.01) |

(52) U.S. Cl.
CPC .......... *H10H 20/013* (2025.01); *H10H 20/81* (2025.01); *H10H 20/812* (2025.01); *H10H 20/8162* (2025.01); *H10H 20/824* (2025.01)

(58) Field of Classification Search
CPC ............... H10H 20/812; H10H 20/013; H10H 20/8162; H10H 20/824; H10H 20/81; H10H 20/80; H10H 20/8242
See application file for complete search history.

(56) References Cited

U.S. PATENT DOCUMENTS

| | | | | |
|---|---|---|---|---|
| 6,108,360 A | * | 8/2000 | Razeghi | ................. H01S 5/343 |
| | | | | 372/45.012 |
| 6,577,659 B1 | * | 6/2003 | Razeghi | ............... H01S 5/3235 |
| | | | | 372/45.01 |

(Continued)

FOREIGN PATENT DOCUMENTS

| | | |
|---|---|---|
| CN | 1941444 B | 6/2011 |
| JP | 2021072394 A | 5/2021 |
| TW | I529962 B | 4/2016 |

OTHER PUBLICATIONS

Aug. 13, 2024, Office Action issued by the Taiwan Intellectual Property Office in the corresponding Taiwanese Patent Application No. 112151718.

*Primary Examiner* — Eduardo A Rodela
(74) *Attorney, Agent, or Firm* — KENJA IP LAW PC

(57) ABSTRACT

A light-emitting element having high emission output power and light emission efficiency and a method of manufacturing of the same are provided. A light-emitting element according to the present disclosure includes an n-type semiconductor layer; an InAsSbP active layer containing at least In and As on the n-type semiconductor layer; a p-type semiconductor layer that is lattice-matched with the InAsSbP active layer, on the InAsSbP active layer; and a p-type InGaAs window layer that is lattice-mismatched with the p-type semiconductor layer, on the p-type semiconductor layer, wherein the p-type semiconductor layer has a thickness of 20 nm or more and 520 nm or less.

7 Claims, 5 Drawing Sheets

(56) References Cited

U.S. PATENT DOCUMENTS

| | | | |
|---|---|---|---|
| 6,876,006 B1 * | 4/2005 | Matveev .............. | H10H 20/824 |
| | | | 257/85 |
| 12,433,066 B2 * | 9/2025 | Kadowaki ............ | H10H 20/812 |
| 2022/0029041 A1 * | 1/2022 | Sekine ................. | H10F 30/225 |
| 2022/0367749 A1 * | 11/2022 | Kadowaki .............. | H10H 20/84 |
| 2022/0406967 A1 * | 12/2022 | Kadowaki ............ | H10H 20/812 |
| 2023/0114703 A1 * | 4/2023 | Yamamoto ........... | H10H 20/018 |
| | | | 257/79 |
| 2023/0155061 A1 * | 5/2023 | Tanaka ................ | H10P 14/2911 |
| | | | 257/98 |

* cited by examiner

LIGHT-EMITTING ELEMENT AND METHOD OF MANUFACTURING THE SAME

TECHNICAL FIELD

The present disclosure relates to a light-emitting element and a method of manufacturing the same.

BACKGROUND

Light-emitting elements with a wavelength range in the mid-infrared region (for example, wavelengths from 3 μm to 5 μm) are widely used in applications such as sensors and gas analysis.

InGaAsSb-based III-V compound semiconductors that include In, As, and Sb are for the active layers of such light-emitting elements. Furthermore, conventionally, when epitaxial layers of InGaAsSb-based III-V compound semiconductors, such as InAsSb layers, are epitaxially grown, InAs substrates or GaSb substrates have been used as growth substrates to achieve lattice matching. In recent years, however, the use of inexpensive GaAs substrates that lattice-mismatch with InAsSb layers, etc, has also been considered.

PTL 1 discloses a light-emitting element that includes an active layer containing an $InAs_ySb_{1-y}$ layer (0<y<1) as a light-emitting layer on a growth substrate that is used as it is, and a bonded-type light-emitting element where a growth substrate has been removed by etching after bonding to a support substrate.

PTL 1 discloses the formation of an $Al_xIn_{1-x}As$ electron blocking layer (0.05≤x≤0.4) with a thickness of 5 nm or more and 40 nm or less.

CITATION LIST

Patent Literature

PTL 1: JP202172394A

SUMMARY

In this specification, the term "window layer" refers to a layer that is in contact with an electrode, has a thickness of 0.5 μm or more, and has a band gap greater than the band gap corresponding to the emission center wavelength. The window layer may be on the light extraction side of the light-emitting element. Or, the window layer may no longer be on the light extraction side of the light-emitting element, when a reflective electrode is provided on the window layer.

In the prior art, InAs layers are used as a p-type layer (also referred to as the p-type cladding layer) and an n-type layer (also referred to as the n-type cladding layer) which sandwich the active layer and supply carriers to the active layer. The band gap of InAs is 0.354 eV (300 K), and the wavelength corresponding to the band gap is about 3500 nm. Therefore, in light-emitting elements with an emission central wavelength (λc) of about 2700 to 3500 nm, if an InAs layer in a composition with a lattice constant that matches the lattice constant of the active layer is formed thick, for example, the emitted light is absorbed inside the InAs layer and the output power is reduced, which is problematic. In addition, a p-type InAs layer having a high carrier concentration tends to have low transmittance even at wavelengths of 3500 nm or longer.

In such a case, possible compositions of the window layer include materials containing Sb, such as GaAsSb or AlAsSb, which have a band gap that allows the transmission of light at the emission wavelength while having a lattice constant that matches the lattice constant of the active layer. There is, however, a cost problem because Sb is expensive. Furthermore, although long-wavelength band LEDs containing Sb are advantageous in reducing power consumption due to their lower forward voltage (Vf) compared to other LEDs, they are more prone to breakdown under voltage stress. This makes it challenging to use them with typical LED driver circuits, necessitating the use of expensive circuits that can be controlled at low voltages.

An object of the present disclosure is to provide a light-emitting element having high emission output power and light emission efficiency and a method of manufacturing the same.

In order to achieve the above-mentioned object, we have completed the following disclosure as a result of diligent research.

In other words, the subject matter of the light-emitting element according to the present disclosure to achieve the above-mentioned object is as follows.

(1) A light-emitting element comprising:
an n-type semiconductor layer;
an InAsSbP active layer containing at least In and As on the n-type semiconductor layer;
a p-type semiconductor layer that is lattice-matched with the InAsSbP active layer, on the InAsSbP active layer; and
a p-type InGaAs window layer that is lattice-mismatched with the p-type semiconductor layer, on the p-type semiconductor layer,
wherein the p-type semiconductor layer has a thickness of 20 nm or more and 520 nm or less.

(2) The light-emitting element according to (1), wherein the InAsSbP active layer has a quantum well structure and an average lattice constant of the quantum well structure is 0.5988 or more and 0.6153 or less.

(3) The light-emitting element according to (1) or (2), wherein the p-type semiconductor layer has a p-type AlInAs electron blocking layer, and the p-type AlInAs electron blocking layer has a thickness of 5 nm or more and 60 nm or less and is made of $Al_xIn_{1-x}As$ (0.05≤x≤0.4).

(4) The light-emitting element according to (3), wherein the p-type semiconductor layer has the p-type AlInAs electron blocking layer on an InAsSbP active layer side and a p-type InAs cladding layer on a side opposite to the InAsSbP active layer.

(5) The light-emitting element according to any one of (1) to (4), wherein the p-type InGaAs window layer is made of $In_wGa_{1-w}As$ (0≤w≤0.2).

(6) A method of manufacturing a light-emitting element, comprising:
forming an n-type semiconductor layer on a growth substrate;
forming an InAsSbP active layer containing at least In and As on the n-type semiconductor layer;
forming a p-type semiconductor layer that is lattice-matched with the InAsSbP active layer, on the InAsSbP active layer; and
forming a p-type InGaAs window layer that is lattice-mismatched with the p-type semiconductor layer, on the p-type semiconductor layer,
wherein the p-type semiconductor layer is formed to a thickness of 20 nm or more and 520 nm or less.

(7) The method of manufacturing a light-emitting element according to (6), wherein the p-type semiconductor layer has a p-type AlInAs electron blocking layer, and the p-type AlInAs electron blocking layer is made of p-type $Al_xIn_{1-x}As$ (0.05≤x≤0.4) with a thickness of 5 nm or more and 60 nm or less.

In this specification, "lattice-matched" refers to cases where the lattice mismatch degree is 3% or less, and "lattice-mismatched" refers to cases where the lattice mismatch degree is greater than 3%, as will be described below.

A light-emitting element with high emission output power and light emission efficiency and a method of manufacturing the same can be provided.

DETAILED DESCRIPTION

Figure 1:
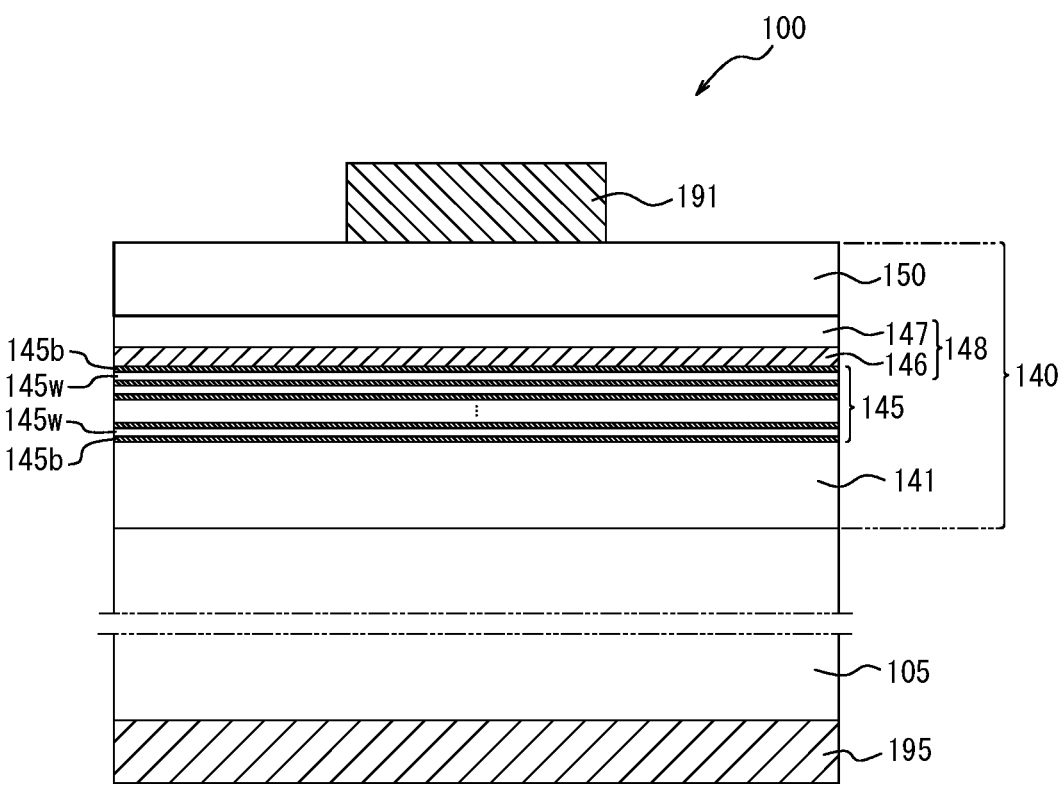
FIG. 1 is a cross-sectional schematic diagram illustrating a first embodiment of a light-emitting element according to the present disclosure.

Prior to describing embodiments of this disclosure, the following points are described beforehand.

An InAsSbP layer containing at least In and As in the present embodiments refers to a compound that is also denoted as $In_xAs_{1-x}Sb_yP_{1-y}$ layer (0<x<1, 0≤y≤1). In addition, when referring to an AlInAs layer or InGaAs layer, it implies that Sb is not included in the composition ratio. However, it is permissible for Sb to be present as an unavoidable impurity element due to diffusion from residual Sb in the chamber or from adjacent layers containing Sb, as long as any Sb source gas is not used during the growth of the layer.

The inclusion of impurity elements in GaAs in the present embodiments is permissible within the scope that achieves the effects of the present disclosure.

In the configuration of the present disclosure, for both p-type and n-type, a value of a carrier concentration obtained by an ECV profiler and a value of an impurity concentration obtained by SIMS analysis is treated without distinguishing between them because the difference between them is small. For example, a measurement value by the ECV profiler (ECV measurement value) may be used as it is the value of an impurity concentration such as Zn. Note that the ECV profiler is a measurement technique in which C-V measurements are performed by bringing an electrolyte into contact and utilizing an electrochemical junction, enabling the measurement of carrier concentrations. Furthermore, the values of carrier concentrations or impurity concentrations of each layer and each region are the values at the center in the thickness direction of each layer and each region in each measurement.

The thickness of each layer formed by epitaxial growth can be calculated based on an observation of a cross-section of the grown layer using an SEM (scanning electron microscope) or a TEM (transmission electron microscope). It is preferred that an SEM is used when the thickness is 10 nm or more while a TEM is used when the thickness is less than 10 nm.

In this specification, "lattice-matched" refers to cases where the lattice mismatch degree is 3% or less, and "lattice-mismatched" refers to cases where the lattice mismatch degree is greater than 3%. The lattice mismatch degree is expressed by the following formula (1), where the lattice constant of a first layer that is to be an underlying layer is denoted as a1, and the lattice constant of a second layer formed on the first layer is denoted as a2:

$$|a2 - a1|/a1. \tag{Expression 1}$$

In the present disclosure, a light-emitting element has a wavelength range in the mid-infrared region (for example, in wavelengths of 2700 nm to 5000 nm). It is particularly effective in a light-emitting element with an emission center wavelength ($\lambda$c) of about 2700 nm to 3500 nm and is also effective in a light-emitting element with an emission center wavelength ($\lambda$c) of 3500 nm to 5000 nm.

Embodiments of the present disclosure will now be described with reference to the drawings. A substrate and layers in each drawing are exaggerated for convenience of description, so that the ratio between the vertical and horizontal dimensions of each illustrated component does not conform to the actual ratio.

First Embodiment

Referring to FIG. 1, one example of a light-emitting element 100, which is a first embodiment of a light-emitting element according to the present disclosure, is described. The light-emitting element 100 has an n-type semiconductor layer 141, an InAsSbP active layer 145 containing at least In and As formed on the n-type semiconductor layer 141, a p-type semiconductor layer 148 formed on the InAsSbP active layer 145 (in the example in FIG. 1, the layer including a p-type AlInAs electron blocking layer 146 and a cladding layer 147), and a p-type InGaAs window layer 150 formed on the p-type semiconductor layer 148. The p-type semiconductor layer 148 has a thickness of 20 nm or more and 520 nm or less.

The p-type AlInAs electron blocking layer 146 may be a p-type $Al_xIn_{1-x}As$ electron blocking layer 146 (0.05≤x≤0.4) with a thickness of 5 nm or more and 40 nm or less. In addition, the cladding layer 147 may be disposed between the p-type AlInAs electron blocking layer 146 and the p-type InGaAs window layer 150, and the cladding layer 147 may be an InAs layer doped with a p-type dopant. Although not illustrated, thin undoped guide layers may be disposed between the n-type semiconductor layer 141 and the active layer 145 and between the p-type AlInAs electron blocking layer 146 and the InAsSbP active layer 145.

In this specification, the semiconductor layers formed on the substrate 105 are collectively referred to as the semiconductor laminate 140. In FIG. 1, a back surface electrode 195 is provided on the back surface of the growth substrate 105. In addition, a top electrode 191 is provided in part on the p-type InGaAs window layer 150. In addition, although not illustrated, the p-type InGaAs window layer 150 may have a p-type contact region having a high carrier concentration on the top electrode side.

Here, in the light-emitting element 100, the InAsSbP active layer 145 and the p-type semiconductor layer 148 are lattice-matched. On the other hand, the p-type semiconductor layer 148 and the p-type InGaAs window layer 150 are lattice-mismatched. In typical light-emitting elements, provision of a lattice-mismatched layer is avoided. In the present disclosure, however, the p-type InGaAs window layer 150 is intentionally formed as a lattice-mismatched layer. Firstly, it is considered that low cost can be achieved and excessively low forward voltage can be avoided by forming layers without Sb. Additionally, since dislocation defects occur at the interface between the p-type semiconductor layer 148 and the p-type InGaAs window layer 150, holes are consumed in non-radiative recombinations at the locations. Here, when the p-type semiconductor layer 148 is provided as the hole supply source at the thickness defined by the present disclosure, it is considered that the supply of holes to the InAsSbP active layer 145 is not a problem any more. Furthermore, it is considered that since the p-type InGaAs window layer 150 can be made from a material with a high transmittance to the emission wavelength (having a band gap larger than that of the well layer by 0.5 eV), the extraction efficiency of light can be improved. In the formation of the p-type InGaAs window layer 150, a region that is grown at a temperature lower than the main growth temperature of the InGaAs window layer (low temperature growth layer) may be provided near the interface with the p-type semiconductor layer 148. By intentionally introducing lattice-mismatched interface in this manner, we have attained both an improvement in emission output power and an improvement in light emission efficiency associated with the increase in emission output power that exceeds the contribution by the increase in forward voltage, leading to the completion of the present disclosure.

In addition, in the present disclosure, the p-type semiconductor layer 148 on the light emitting layer side than the interface may be formed as a layer with a high hole carrier concentration of $1 \times 10^{18}$ atoms/cm$^3$ or more. The thickness of the p-type semiconductor layer 148 must be in a specific range so that the p-type semiconductor layer 148 supplies sufficient carriers to the InAsSbP active layer 145 because the flow of carriers is inhibited at the interface. The p-type semiconductor layer 148 has a thickness of 20 nm or more and 520 nm or less, preferably 20 nm or more and 100 nm or less, and more preferably 20 nm or more and 60 nm or less. Hereinafter, each component of the light-emitting element 100 will be described in detail.

<n-Type Semiconductor Layer>
—Composition—

The n-type semiconductor layer 141 preferably has a composition lattice-matched with the composition of the InAsSbP active layer 145. The composition of the n-type semiconductor layer 141 is preferably AlInAs having a smaller Al composition ratio (i.e., smaller band gap) than that of the p-type AlInAs electron blocking layer 146, and InAs is more preferred. The lattice constant of InAs is 0.60584. Therefore, when the composition of the n-type semiconductor layer 141 is InAs, the lattice mismatch degrees are 0.1% and 0.1% when the composition of the InAsSbP active layer 145 is InAs$_{0.95}$Sb$_{0.05}$ and InAs$_{0.88}$Sb$_{0.12}$, respectively.

—Thickness—

The n-type semiconductor layer 141 has a thickness of preferably 500 nm or more and 6000 nm or less. When the lattice constants of the growth substrate 105 and the InAsSbP active layer 145 are different, defects will propagate to the InAsSbP active layer 145 if the thickness of the n-type semiconductor layer 141 is smaller than 500 nm. In addition, if the thickness of the n-type semiconductor layer 141 is smaller than 500 nm, a sufficient amount of carriers are not supplied to the InAsSbP active layer 145, resulting in low emission output power. On the other hand, when the thickness of the n-type semiconductor layer 141 exceeds 6000 nm, significant improvement in characteristics is not expected. Moreover, the prolonged growth time increases material costs, posing productivity issues, which is undesirable.

—Dopant—

The carrier concentration determined by an ECV measurement or the impurity concentration of n-type impurities of the n-type semiconductor layer 141 is preferably $1 \times 10^{18}$ atoms/cm$^3$ or more and $3 \times 10^{19}$ atoms/cm$^3$ or less. In addition, the n-type semiconductor layer 141 preferably has an n-type cladding region and an n-type contact region that has a higher carrier concentration and higher conductivity than those of the n-type cladding region and is advantageous for formation of an electrode. In the n-type contact region, the carrier concentration determined by an ECV measurement or the impurity concentration of n-type impurities is preferably $8 \times 10^{18}$ atoms/cm$^3$ or more and $3 \times 10^{19}$ atoms/cm$^3$ or less. Furthermore, in the n-type cladding region, the carrier concentration measured by an ECV measurement or the impurity concentration of n-type impurities is preferably $1 \times 10^{18}$ atoms/cm$^3$ or more and $8 \times 10^{18}$ atoms/cm$^3$ or less. Note that, when an n-type carrier concentration determined by an ECV measurement is denoted, it is preceded with a 'minus' sign to distinguish it from the p-type carrier concentrations.

<n-Side Guide Layer>

An undoped guide layer may be provided between the n-type semiconductor layer 141 and the InAsSbP active layer 145. The undoped guide layer preferably has a thickness of 1 nm or more and 100 nm or less. The guide layer between the n-type semiconductor layer 141 and the InAsSbP active layer 145 is preferably a layer that has the same composition as that of a barrier layer of the InAsSbP active layer 145 or the n-type semiconductor layer 141 and is not doped with no n-type impurities. This guide layer prevents the diffusion of n-type impurities from the n-type semiconductor layer 141 to the InAsSbP active layer 145.

<InAsSbP Active Layer>

The InAsSbP active layer 145 includes InAs$_y$Sb$_{1-y}$ layers 145w (0<y<1) that serve as the light emitting layers. In FIG. 1, the quantum well structure where the InAsSbP active layer 145 also has InAs$_z$P$_{1-z}$ layers 145b (0<z<1), and the InAs$_y$Sb$_{1-y}$ layers 145w serve as well layers and the InAs$_z$P$_{1-z}$ layers 145b serve as barrier layers is illustrated as an example. However, the InAsSbP active layer 145 may have a single-layer structure of the InAs$_y$Sb$_{1-y}$ layer 145w. The InAsSbP active layer 145 preferably has a multiple quantum well (MQW) structure as illustrated in FIG. 1 to improve optical output power due to suppression of crystal defects. This multiple quantum well structure can be formed by alternately repeating the well and barrier layers described above.

—Composition and Emission Peak Wavelength of InAsSbP Active Layer—

The As composition y of the InAs$_y$Sb$_{1-y}$ layer 145w serving as the well layer is preferably 0.7≤y<1.0, and more preferably 0.80≤y≤0.95. In addition, the As composition z of the InAs$_z$P$_{1-z}$ layer 145b serving as the barrier layer is preferably 0.50≤z<1.0, and more preferably 0.8≤z≤0.95. In the case of a quantum well structure, in addition to changing the composition, it is also desirable to adjust the difference in composition between the well layers and the barrier layers to add strain to the well layers. By such a change in the composition of the InAsSbP active layer 145, the emission peak wavelength of the light-emitting element 100 can be set from 1700 nm to 12000 nm (1.7 μm to 12 μm).

The light-emitting element according to the present disclosure has a wavelength range in the mid-infrared region (for example, in wavelengths of 2700 nm to 5000 nm). Considering the transmittance of InAs, it is particularly effective in a light-emitting element with an emission center wavelength ($\lambda c$) of about 2700 to 3500 nm and also effective in a light-emitting element with an emission center wavelength ($\lambda c$) of 3500 nm to 5000 nm. In addition, it is preferable that the InAsSbP active layer 145 has a quantum well structure and the average lattice constant of the quantum well structure is 0.5988 or more and 0.6153 or less.

—Determination of Composition Ratios (Solid Phase Ratios) of Layer and Determination of Lattice Constant—

The average lattice constant of the InAsSbP active layer 145 is determined from the composition ratios and thicknesses of the well and barrier layers as follows. Firstly, an $\omega/2\theta$ scan with an X-ray diffractometer was performed, and the composition ratios (hereafter also described as solid phase ratio) of the InAsSbP active layer 145 with 20.5 pairs of well and barrier layers were calculated by fitting using analysis software (Jordan Valley RADS) on the basis of the peak position of InAs stacked to 5 μm on the substrate. The determined solid phase ratios were then used to determine the lattice constant using Vegard's rule. Calculation examples of lattice constants will be specifically described. In this specification, calculations were carried out in accordance with the known publications E. Fred Schubert, "Light-Emitting Diodes", Asakura Shoten Co., Ltd., Jan. 25, 2010, First Edition, p. 344-p. 345 and FIG. 12.6 in the this book, and Haruo Nagai, Sadao Adachi, Takashi Fukui, "III-V Semiconductor Alloys", CORONA PUBLISHING CO., LTD., Jul. 30, 1993, p. 39, First Edition, Second Printing. The following values were used for the known lattice constants of each composition.

The lattice constant of InAs: 0.60584
The lattice constant of InP: 0.58686
The lattice constant of InSb: 0.64794

Calculation Example 1

The lattice constants of 20.5 pairs of active layers and barrier layers, laminated with a composition of $InAs_{0.95}Sb_{0.5}/InAs_{0.92}P_{0.08}$, were determined using fitting analysis software from the following values.

The Sb solid phase ratio and the As solid phase ratio of the well layers $InAs_{0.95}Sb_{0.5}$ are 0.0464 and 0.9536, respectively. From Vegard's rule, the lattice constant of $InAs_{0.95}Sb_{0.05}$ is 0.6078. Subsequently, the As solid phase ratio and the P solid phase ratio of the barrier layers $InAs_{0.92}P_{0.08}$ are 0.9187 and 0.0813, respectively. From Vegard's rule, the lattice constant of $InAs_{0.92}P_{0.08}$ is 0.6043. If the thicknesses of the well and barrier layers are 10 nm and 30 nm, respectively, the average lattice constant considering the thicknesses is 0.6052 ($0.6078\times10/40+0.6043\times30/40=0.6052$).

Calculation Example 2

The lattice constants of 20.5 pairs of active layers and barrier layers, laminated with a composition of $InAs_{0.88}Sb_{0.12}/InAs_{0.88}P_{0.12}$, were determined using fitting analysis software from the following values.

The Sb solid phase ratio and the As solid phase ratio of the well layers $InAs_{0.88}Sb_{0.12}$ are 0.1183 and 0.8817, respectively. From Vegard's rule, the lattice constant of $InAs_{0.88}Sb_{0.12}$ is 0.6108. Subsequently, the As solid phase ratio and the P solid phase ratio of the barrier layer $InAs_{0.88}P_{0.12}$ is 0.8823 and 0.1177, respectively. From Vegard's rule, the lattice constant of $InAs_{0.88}P_{0.12}$ is 0.6036. If the thicknesses of the well and barrier layers are 10 nm and 30 nm, respectively, the average lattice constant considering the thicknesses is 0.6054 ($0.6108\times10/40+0.6036\times30/40=0.6054$).

In Examples 1 to 4 to be described below, $\lambda c$ is 3200 nm, and the lattice constant of an active layer having well layers of $InAs_{0.95}Sb_{0.05}$ is 0.6052. In Example 5, $\lambda c$ is 3800 nm and the lattice constant of an active layer having well layers of $InAs_{0.88}Sb_{0.12}$ is 0.6054.

<p-Type Semiconductor Layer>

The p-type semiconductor layer 148 is a general term for p-type semiconductor layers that are present between the InAsSbP active layer 145 and the p-type InGaAs window layer 150 and are lattice-matched with the InAsSbP active layer 145, and is the entire p-type layers excluding the p-type InGaAs window layer 150. In the case where a p-type AlInAs electron blocking layer 146 and a cladding layer 147 are present, the p-type AlInAs electron blocking layer 146 and the cladding layer 147 are collectively referred to as the p-type semiconductor layer 148. The p-type semiconductor layer 148 has a thickness of 20 nm or more and 520 nm or less, and more preferably 30 nm or more and 100 nm or less. This is because, if the thickness is less than 20 nm, the p-type semiconductor layer 148 that supplies holes to the InAsSbP active layer 145 becomes too thin, leading to insufficient hole supply to the InAsSbP active layer 145, resulting in reduced emission output power. If the thickness is greater than 520 nm, the effect of the present disclosure in increasing output power is diminished.

<<p-Type AlInAs Electron Blocking Layer>>

The p-type semiconductor layer 148 preferably has a p-type AlInAs electron blocking layer 146. The p-type AlInAs electron blocking layer 146 is preferably made of p-type $Al_xIn_{1-x}As$ ($0.05\leq x\leq0.4$) with a thickness of 5 nm or more and 60 nm or less. The provision of the p-type $Al_xIn_{1-x}As$ ($0.05\leq x\leq0.4$) with a thickness of 5 nm or more and 60 nm or less on the InAsSbP active layer 145 in the light-emitting element 100 can improve the light emission efficiency.

—Composition—

The composition of the p-type AlInAs electron blocking layer 146 is preferably $Al_xIn_{1-x}As$ ($0.05\leq x\leq0.40$), and more preferably $Al_xIn_{1-x}As$ ($0.10\leq x\leq0.35$). This is because an Al composition x of 0.05 or higher can improve the light emission efficiency by the p-type AlInAs electron blocking layer 146, and an Al composition x of 0.40 or lower can suppress the decrease in light emission efficiency due to an increased forward voltage.

The compositions of the InAsSbP active layer 145 and the AlInAs electron blocking layer 146 are adjusted so that a lattice match is achieved. As for the above-described Al composition x, the lattice constant is 0.6039 when x=0.05 and 0.5899 when x=0.4 from Vegard's rule. For example, the lattice mismatch degrees between the average lattice constant of the InAsSbP active layer 145 ($InAs_{0.95}Sb_{0.05}/InAs_{0.92}P_{0.08}$) and the p-type AlInAs electron blocking layer 146 with an Al composition x=0.4 and x=0.05 are 2.5% and 0.2%, respectively. In addition, the lattice mismatch degrees between the average lattice constant of the InAsSbP active layer 145 ($InAs_{0.88}Sb_{0.12}/InAs_{0.88}P_{0.12}$) and the p-type AlInAs electron blocking layer 146 with an Al composition x=0.4 and x=0.05 are 2.6% and 0.2%, respectively.

The composition ratio (solid phase ratio) x can be calculated by $\omega/2\theta$ scanning with an X-ray diffractometer and fitting using analysis software (Jordan Valley RADS).

—Thickness—

The p-type AlInAs electron blocking layer 146 has a thickness of preferably 5 nm or more and 60 nm or less, and more preferably 10 nm or more and 35 nm or less. This is because, if the thickness is greater than 60 nm, the forward voltage increases, leading to a decrease in light emission efficiency. If the thickness is less than 5 nm, the effect of improving the light emission efficiency by the p-type AlInAs electron blocking layer 146 may not be obtained.

—Dopant—

The p-type AlInAs electron blocking layer 146 is doped with a p-type dopant. Zn is particularly preferred as the p-type dopant. When the carrier concentration determined by an ECV measurement or the impurity concentration of p-type dopants measured by a SIMS analysis is $1\times10^{18}$ atoms/cm$^3$ or more and $8\times10^{18}$ atoms/cm$^3$ or less, the effect of further improving the light emission efficiency can be ensured, and $2\times10^{18}$ atoms/cm$^3$ or more is more preferred.

<<Cladding Layer>>

—Composition—

The composition of the cladding layer 147 is adjusted to lattice-match with the InAsSbP active layer 145. The cladding layer 147 is preferably made of AlInAs, which has a smaller Al composition ratio (i.e., smaller band gap) than the p-type AlInAs electron blocking layer 146, and InAs is more preferred. For example, in the case where the cladding layer 147 is made of InAs, the lattice constant of the cladding layer 147 is 0.6058. Therefore, the lattice mismatch degrees when the composition of the above InAsSbP active layer 145 is InAs$_{0.95}$Sb$_{0.05}$ and InAs$_{0.88}$Sb$_{0.12}$ are 0.1% and 0.1%, respectively.

The composition ratio (solid phase ratio) can be calculated by $\omega/2\theta$ scanning with an X-ray diffractometer and fitting using analysis software (Jordan Valley RADS).

—Thickness—

The cladding layer 147 has a thickness of preferably 0 nm or more and 500 nm or less. If the thickness is greater than 500 nm, the light emitted by the InAsSbP active layer 145 is absorbed, leading to a reduction in the emission output power of the light-emitting element. Furthermore, when the thickness of the cladding layer 147 is 0 nm, it is sufficient to provide a p-type AlInAs electron blocking layer 146 with a sufficient thickness. This is because if thicknesses of the cladding layer 147 and the p-type AlInAs electron blocking layer 146 are not sufficient to meet the thickness of the later-described p-type semiconductor layer 148, sufficient holes are not provided to the InAsSbP active layer 145.

—Dopant—

When a cladding layer 147 is provided, the cladding layer 147 must be doped with a p-type dopant. If the layer is undoped, it does not function to supply holes and does not contribute to light emission. The carrier concentration determined by an ECV measurement or the impurity concentration of p-type dopants measured by a SIMS analysis is preferably $1\times10^{18}$ atoms/cm$^3$ or more and $6\times10^{18}$ atoms/cm$^3$ or less.

<p-Type InGaAs Window Layer>

—Composition—

The composition of the p-type InGaAs window layer 150 is preferably In$_w$Ga$_{1-w}$As ($0 \leq w \leq 0.2$) in view of transparency to the emission wavelength. The composition ratio (solid phase ratio) w can be calculated by $\omega/2\theta$ scanning with an X-ray diffractometer and fitting using analysis software (Jordan Valley RADS).

The p-type InGaAs window layer 150 and the p-type semiconductor layer 148 are lattice-mismatched. In the case where the p-type InGaAs window layer 150 is formed directly on the p-type AlInAs electron blocking layer 146, the lattice constant of the p-type AlInAs electron blocking layer 146 is 0.6039 when Al$_x$In$_{1-x}$As (x=0.05) and 0.5899 when Al$_x$In$_{1-x}$As (x=0.4), and the lattice constant of the Zn-doped p-type InGaAs window layer 150 is 0.5657 when GaAs, from Vegard's law. Therefore, the lattice mismatch degree between the Al$_{0.05}$In$_{0.95}$As electron blocking layer and the Zn-doped p-type InGaAs window layer is 6.3%, and the lattice mismatch degree between the Al$_{0.4}$In$_{0.6}$As electron blocking layer and the Zn-doped p-type GaAs window layer is 4.1%. In case where the p-type GaAs window layer is formed directly on the p-type InAs cladding layer, the lattice mismatch degree is 6.6% because the lattice constant of InAs is 0.60584. When the Al composition ratio w=0.2, the lattice mismatch degree also exceeds 3%.

—Thickness—

The p-type InGaAs window layer 150 has a thickness of preferably 500 nm or more and 2000 nm or less. If the p-type InGaAs window layer 150 is thicker than the above range, the current may spread to the ends of the LED chip, leading to an increase in surface recombination or an increase in the ohmic resistance of the device, resulting in a decrease in light emission efficiency. If the p-type InGaAs window layer 150 is thinner than the above range, light emission may occur directly beneath the electrode, obstructing the extraction of light.

—Dopant—

The carrier concentration determined by an ECV measurement or the impurity concentration of p-type impurities of the p-type InGaAs window layer 150 is preferably $1\times10^{18}$ atoms/cm$^3$ or more and $3\times10^{19}$ atoms/cm$^3$ or less. It is also preferable that the p-type InGaAs window layer 150 has a p-type contact region with a higher conductivity on the side where the electrode is to be formed by increasing the carrier concentration so as to be higher than that in the main region of the p-type InGaAs window layer, which is advantageous for formation of the electrode. The carrier concentration or the impurity concentration of p-type impurities in the p-type contact region of the p-type InGaAs window layer 150 is preferably $8\times10^{18}$ atoms/cm$^3$ or more and $3\times10^{19}$ atoms/cm$^3$ or less.

—Substrate—

Here, the substrate applicable to the light-emitting element 100 is described in detail. The substrate may be any substrate that is thick enough to mechanically maintain the shape of the semiconductor laminate 140 including the InAsSbP active layer 145, or may be a growth substrate 105 used for epitaxial growth for forming the semiconductor laminate 140 of the light-emitting element 100. Compound substrates such as substrates of GaAs, InP, InAs, GaSb, and InSb can be used as the growth substrate 105, and a GaAs substrate is preferred. When a GaAs substrate is used, it is also preferable to provide a buffer layer between the growth substrate 105 and the n-type semiconductor layer 141 to mitigate lattice mismatch, and the buffer layer can be an InAs buffer layer grown at a low temperature. In addition, when the growth substrate 105 is made of GaAs and the above-described p-type InGaAs window layer 150 is made of GaAs, the strain is relaxed and the warpage of the growth substrate 105 is reduced. This effect of reducing the warpage of the growth substrate 105 is effective for the steps of forming electrodes and bonding with a support substrate in a second embodiment to be described below.

(Method of Manufacturing Light-Emitting Element)

Hereinafter, one example of an embodiment of a method of manufacturing the light-emitting element 100 described above will be described. When a growth substrate 105 used for epitaxial growth of each semiconductor layer in the semiconductor laminate 140 is n-type or undoped, the light-emitting element 100 can be manufactured through steps of forming an n-type semiconductor layer 141 on the growth substrate 105; forming an InAsSbP active layer 145 containing at least In and As on the n-type semiconductor layer 141; forming a p-type semiconductor layer 148 on the InAsSbP active layer 145; forming a p-type InGaAs window layer 150 on the p-type semiconductor layer 148; and forming a p-type InGaAs window layer 150 that is lattice-mismatched with the p-type semiconductor layer 148, on the p-type semiconductor layer 148. In this case, the thickness of the p-type semiconductor layer 148 is 20 nm or more and 520 nm or less.

In addition, it is preferable that the step of forming the p-type semiconductor layer 148 includes the step of forming a p-type AlInAs electron blocking layer 146, and it is also preferable that it further includes the step of forming a cladding layer 147 on the p-type AlInAs electron blocking layer 146.

Alternatively, when a growth substrate 105 used for the epitaxial growth of each semiconductor layer in the semiconductor laminate 140 is p-type, the element can be manufactured through the steps of forming a p-type InGaAs window layer 150 on the growth substrate; forming a p-type semiconductor layer 148 on the p-type InGaAs window layer 150; forming an InAsSbP active layer 145 on the p-type semiconductor layer 148; and forming an n-type semiconductor layer 141 on the InAsSbP active layer 145.

—Growth Method of Semiconductor Laminate—

Each semiconductor layer can be formed by epitaxial growth, using well-known thin-film growth methods such as metal organic chemical vapor deposition (MOCVD) or molecular beam epitaxy (MBE). For example, trimethylindium (TMIn) may be used as an In source, trimethylgallium (TMGa) or triethylgallium (TEGa) as the Ga sources, trimethylaluminum (TMAl) as the Al source, arsine ($AsH_3$) or tertiarybutylarsine (TBAs) as the As sources, trimethylantimony (TMSb), triethylantimony (TESb), or trisdimethylaminoantimony (TDMASb) as the Sb source, and phosphine ($PH_3$) or tertiarybutylphosphine (TBP) as the P sources at a predetermined mixing ratio, and these source gases may be subjected to vapor phase epitaxy using a carrier gas to form each layer having a desired thickness by controlling the growth time. When the layers are p-type or n-type doped, a dopant source gas can be used in addition as desired. For example, for doping Zn, DEZn (diethylzinc) gas or the like can be used. Note that InAs is n-type even when it is undoped.

—Other Semiconductor Layers in Semiconductor Laminate—

Additionally, the semiconductor laminate 140 may also be subjected to a step of forming an undoped guide layer (e.g., an undoped InAs layer) between the n-type semiconductor layer 141 and the InAsSbP active layer 145, or between the InAsSbP active layer 145 and the p-type semiconductor layer 148.

—Electrode-Furthermore, as illustrated in FIG. 1, a top electrode 191 may be formed on the p-type InGaAs window layer 150 and a back electrode 195 may be provided on the back surface of the growth substrate 105. The top electrode

191 may include a wiring portion and a pad portion of an ohmic electrode, and the pad portion may have a metal layer or solder used for bonding, which is not illustrated. Known metal materials and formation methods may be used to form the top electrode 191 and the back electrode 195. Example metal materials that can be used include Ti, Pt, Au, Ag, Al, Zn, and Ni.

Second Embodiment

Figure 2:
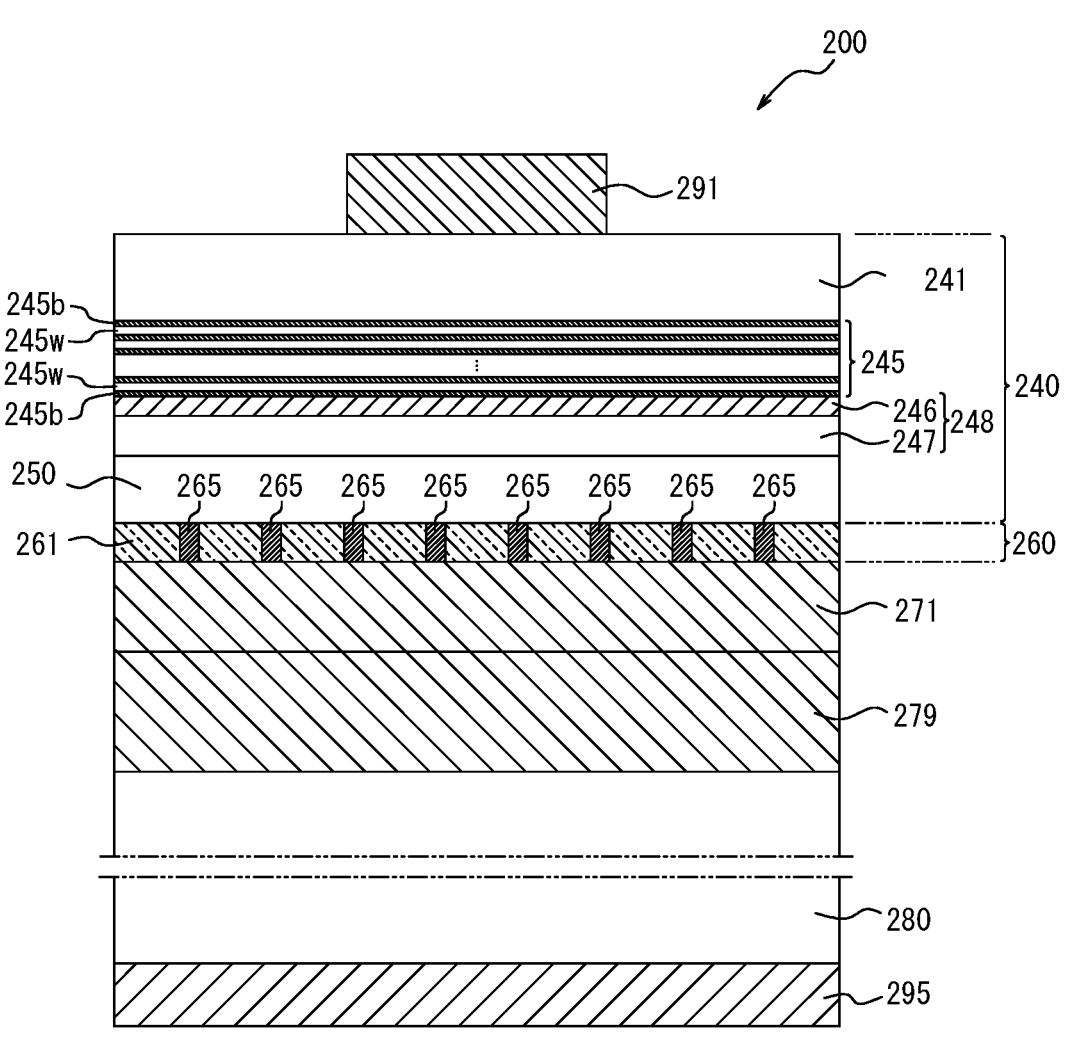
FIG. 2 is a cross-sectional schematic diagram illustrating a second embodiment of the light-emitting element according to the present disclosure.

Referring to FIG. 2, a light-emitting element 200 according to the second embodiment of the present disclosure will be described. The light-emitting element 200 is a bonded-type light-emitting element obtained by bonding a support substrate and then removing the growth substrate. In principle, components that are the same as those in the above-described light-emitting element 100 are denoted by reference numerals having the same lower two digits in three-digit numbers, and redundant explanations are omitted. The light-emitting element 200 includes at least a support substrate 280, a metal bonding layer 279 provided on a surface of the support substrate 280, a metal reflective layer 271, a power distribution portion 260 that is provided on the metal reflective layer 271 and includes a transparent insulating layer 261 having through holes and an ohmic electrode portion 265 provided in the through holes, and a semiconductor laminate 240 provided on the power distribution portion 260.

The semiconductor laminate 240 in the light-emitting element 200 includes, in order from the opposite side to the support substrate 280, an n-type semiconductor layer 241, an InAsSbP active layer 245, a p-type semiconductor layer 248, and a p-type InGaAs window layer 250. The p-type semiconductor layer 248 may include a p-type AlInAs electron blocking layer 246 and a cladding layer 247.

As a support substrate 280 different from the growth substrate, a substrate that is less expensive and has high thermal conductivity than the growth substrate is preferably used. For example, compound substrates of Si, Ge, GaAs, and the like, as well as metal substrates made of metals capable of suppressing thermal expansion coefficients, such as copper alloys, molybdenum, tungsten, and Kovar. Alternatively, submount substrates having a ceramic substrate such as AlN substrate attached to a metal can be used. It is also preferable to use a Si substrate as the support substrate 280 in view of processability and price.

In this bonded-type embodiment where the support substrate 280 is bonded and then the growth substrate is removed as described below, the light emission efficiency can be improved by providing the p-type semiconductor layer 248 having the thickness as described above and the p-type InGaAs window layer 250 that is lattice-mismatched with the p-type semiconductor layer 248, on the p-type semiconductor layer 248. One example of an embodiment of the light-emitting element 200 and a method of manufacturing the same will be described in more detail below with reference to FIGS. 3 to 5.

Figure 3:
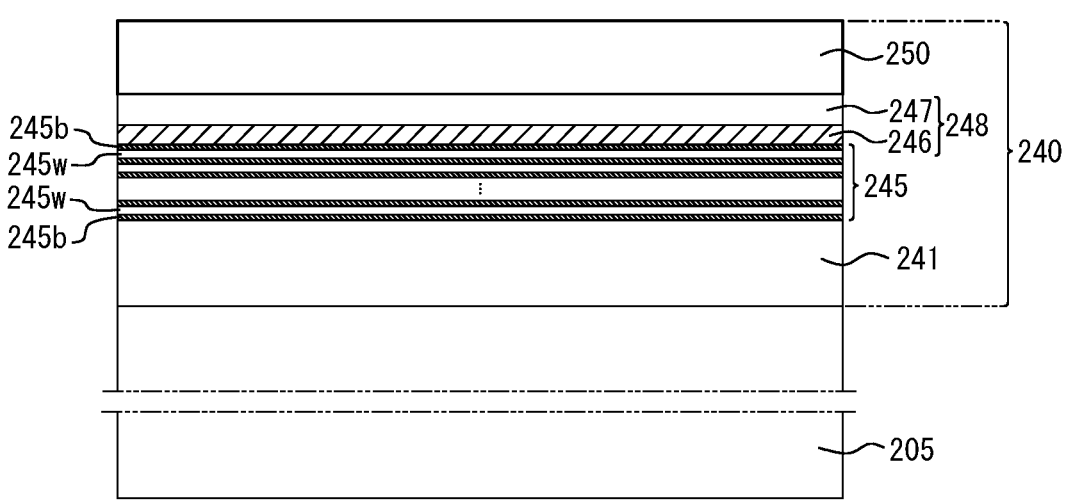
FIG. 3 is a cross-sectional schematic diagram illustrating one example of a method of manufacturing the second embodiment of the light-emitting element according to the present disclosure.

Firstly, a growth substrate 205 is provided. With reference to FIG. 3, a semiconductor laminate 240 is formed. At this time, an etch stop layer, which is not illustrated, may be formed on the growth substrate 205. The semiconductor laminate 240 is similar to the semiconductor laminate 140 described above.

<Formation of Power Distribution Portion>

A power distribution portion 260 having a transparent insulating layer 261 that has through holes and an ohmic electrode portion 265 provided in the through holes is formed on the p-type InGaAs window layer 250 (or on a p-type contact region of the p-type InGaAs window layer when the p-type contact region is provided). One example of a specific mode of forming the power distribution portion 260 is described below with reference to FIGS. 4 and 5, although the specific method for forming the power distribution portion 260 is arbitrarily selected.

Firstly, a transparent insulating layer 261 is deposited on the semiconductor laminate 240. For the film deposition, a known technique such as plasma CVD and sputtering can be used. Subsequently, a resist pattern of the power distribution portion is formed on the transparent insulating layer 261 using a photomask. A portion of the transparent insulating layer 261 is then removed by etching using a resist pattern to form through holes. By providing through holes, parts of the areas of the top surface of the semiconductor laminate 240 are exposed. Then, the ohmic electrode portion 265 can be deposited, followed by lift-off using a resist pattern to form the power distribution portion 260. In the power distribution portion 260, the transparent insulating layer 261 and the ohmic electrode portion 265 are arranged in parallel. The ohmic electrode portion 265 is illustrated to be filled in the through holes in the drawings for the sake of simplicity. However, this is not limiting, and the transparent insulating layer 261 and the ohmic electrode portion 265 may be spaced apart.

The ohmic electrode portion 265 can be formed into islands distributed in a predetermined pattern. For example, Au, AuZn, AuBe, AuTi, or the like may be used as the ohmic electrode portion 265, and a laminated structure of these is also preferably used. For example, Ti/Au may be used as the ohmic electrode portion 265. The thickness (or the total thickness) of the ohmic electrode portion 265 may be for example, but not limited to 300 nm to 1300 nm, preferably 350 nm to 800 nm.

As the transparent insulating layer 261, a single layer or multiple layers of $SiO_2$, SiN, ITO, $Al_2O_3$, AlN, or the like can be used.

<Formation of Metal Reflective Layer>

Figure 4:
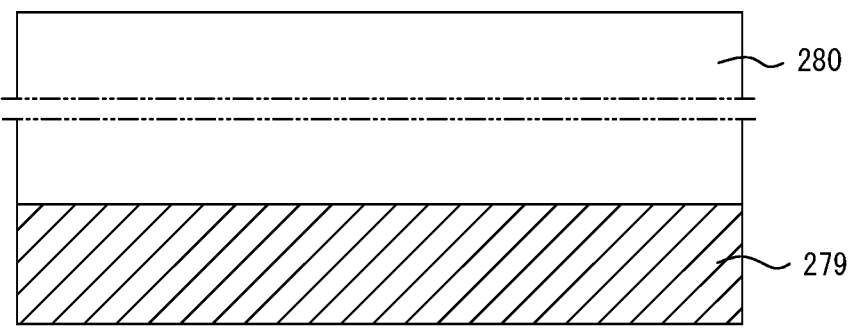
FIG. 4 is a cross-sectional schematic diagram illustrating one example of the method of manufacturing following FIG. 3.
Figure 4:
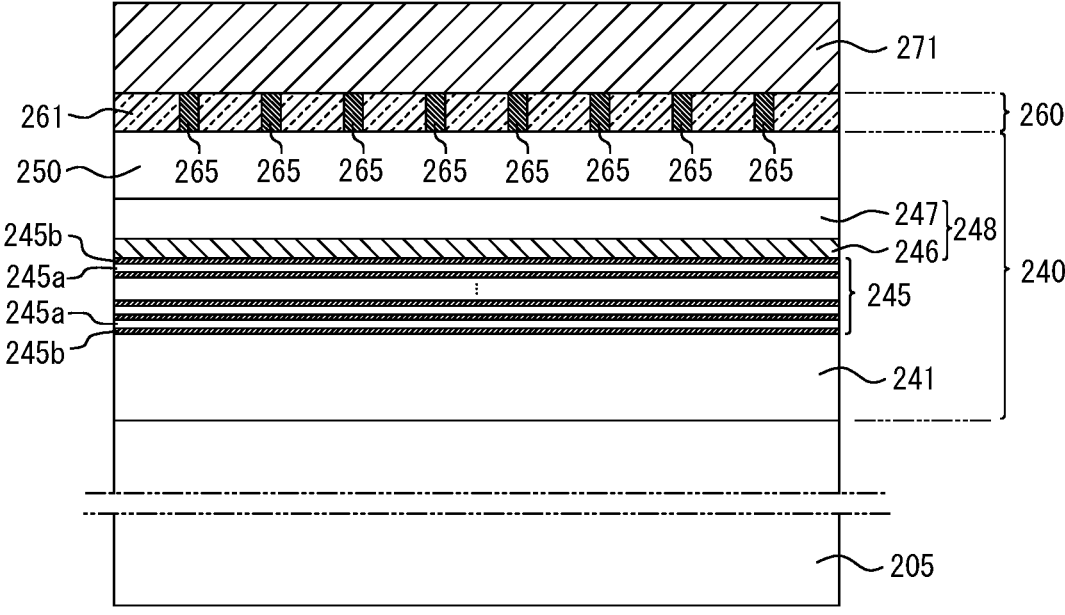

As illustrated in FIG. 4, it is also preferable to form a metal reflective layer 271 on the power distribution portion 260. The metal reflective layer 271 may include multiple layers of metal, and Al, Pt, Ti, Ag, and other metals can be used to form the metal reflective layer 271 in addition to Au. For example, the metal reflective layer 271 may be constituted by a single layer formed of Au only; alternatively, the metal reflective layer 271 may include two or more Au metal layers. The metal reflective layer 271 preferably contains 50% by mass or more of Au in the composition of the metal reflective layer 271. In order to ensure bonding to the metal bonding layer 279 in the subsequent bonding step, the outermost surface layer of the metal reflective layer 271 (the surface opposite to the semiconductor laminate 240) is preferably an Au metal layer.

For example, the metal reflective layer 271 can be formed by depositing metal layers of Al, Au, Pt, and Au, in this order, on the power distribution portion 260 (including spaces as described above if there are spaces). The thickness of one Au metal layer in the metal reflective layer 271 may be for example 400 nm to 2000 nm, and the thickness of each metal layer formed of a metal other than Au may be for example 5 nm to 200 nm. The metal reflective layer 271 can be formed by depositing a film by using common methods such as vapor deposition.

<Bonding with Support Substrate>

The bonding with a support substrate is described with reference to FIG. 4. The semiconductor laminate 240 and the power distribution portion 260 are bonded to the support substrate 280 via at least a metal bonding layer 279. The metal reflective layer 271 and the metal bonding layer 279 may be bonded by providing a metal reflective layer 271. The metal bonding layer 279 and the metal reflective layer 271 are arranged so as to face each other, followed by bonding of the layers by thermocompression bonding at a temperature of approximately 250° C. to 500° C.

<<Metal Bonding Layer>>

Metals such as Ti, Pt, and Au, metals that form eutectic alloys with Au (such as Sn), or solders can be used to form the metal bonding layer 279, and the metal bonding layer 279 is preferably formed by laminating these metals. For example, a laminate obtained by stacking Ti with a thickness of 400 nm to 800 nm, Pt with a thickness of 5 nm to 20 nm, and Au with a thickness of 700 nm to 1200 nm in this order from the surface of the support substrate 280 can be used to form the metal bonding layer 279. For example, when the metal reflective layer 271 and the metal bonding layer 279 are bonded together, the top layer of the metal bonding layer 279 may be formed from Au metal, and the top layer of the metal reflective layer 271 may also be formed from Au, to thereby accomplish bonding through Au—Au diffusion.

<<Support Substrate>>

The support substrate 280 may be any substrate that is different in type from the growth substrate 205, and may be a semiconductor substrate, a metal substrate, or a submount substrate based on a ceramic substrate as described above. Since the above-described bonding method is used, the support substrate 280 may be lattice-mismatched with each semiconductor layer formed in this embodiment. The support substrate 280 is preferably a conductive substrate, although it may be insulative depending on applications. It is preferable to use a Si substrate as the support substrate 280 in view of processability and price. The use of a Si substrate can significantly reduce the thickness of the conductive support substrate 280 compared to conventional methods, and is suitable in implementations where a semiconductor device of various types is combined. Further, a Si substrate is also advantageous in terms of heat dissipation as compared with an InAs substrate.

<<Removal of Growth Substrate>>

Figure 5:
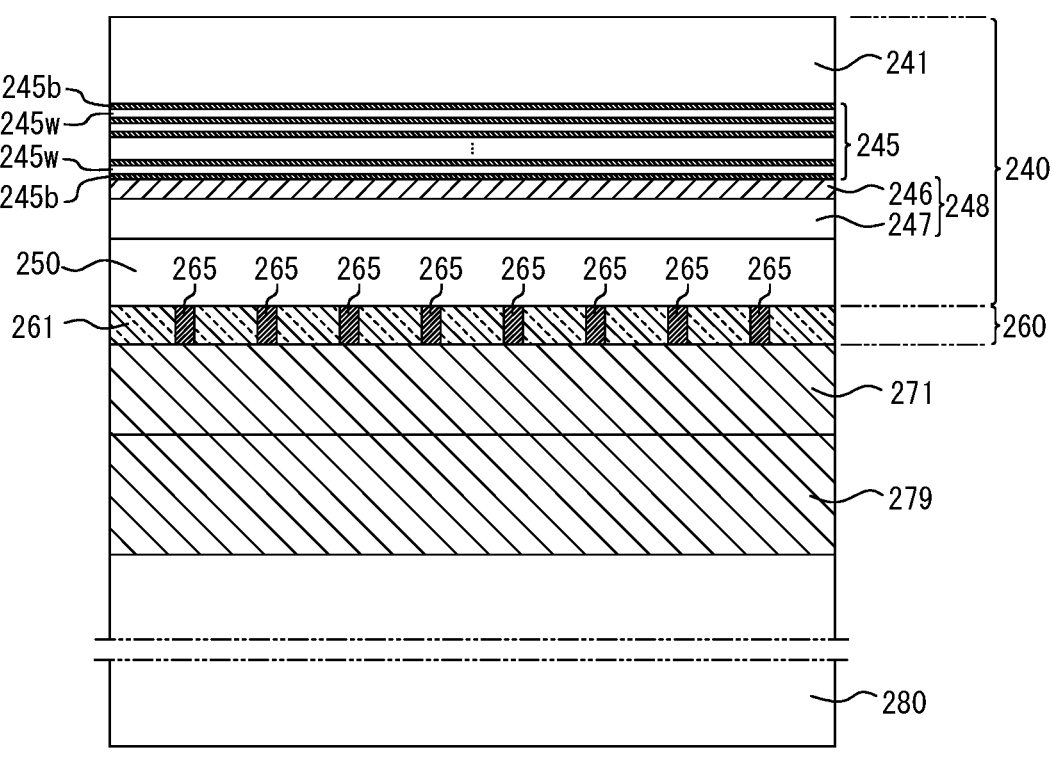
FIG. 5 is a cross-sectional schematic diagram illustrating one example of the method of manufacturing following FIG. 4.

Referring to FIG. 5, the removal of the growth substrate is described. After the support substrate 280 is bonded, the growth substrate 205 is removed. In the case where the growth substrate 205 is a GaAs substrate, for example, the growth substrate 205 can be wet etched using an ammonia-hydrogen peroxide mixture. When an etch stop layer is used, the etching stop may be removed subsequently to the removal of the growth substrate 205. A part of the etch stop layer may remain to be used as an n-type contact layer that reduces contact resistance to the top electrode 291.

—Electrode Formation Step—

Furthermore, as illustrated FIG. 2 which was previously referenced, a top electrode 291 may be formed on the semiconductor laminate 240, and a back electrode 295 may be formed on the back surface of the support substrate 280. The top electrode 291 may include a wiring portion and a pad portion. The top electrode 291 and the back electrode 295 can be formed by a known technique; for example, sputtering, electron-beam physical vapor deposition (also referred to as vapor deposition method), resistance heating, etc. can be used. In addition to the method by using a metal mask, a method with a combination of photolithography and lift-off or metal etching can be used to pattern the electrodes.

The light-emitting element 200 illustrated in FIG. 2 can be obtained by the above manufacturing method. These embodiments are exemplary and are not limiting. The sides of the element may be tapered in mesa etching, both of the electrodes may be on the top electrodes or flip chip, and can be modified as needed.

EXAMPLES

The present disclosure will be described in more detail below using examples. However, this disclosure is not limited to the following examples.

Experimental Example 1

Example 1

Firstly, a Te-doped n-type InAs layer (thickness: 5.2 μm) was formed as an n-type semiconductor layer on the (100) surface of a Si-doped n-type GaAs growth substrate (substrate thickness: 350 μm) using the MOCVD method. The growth substrate side of the n-type semiconductor layer was formed as an n-type contact area (thickness: 0.3 μm) having a high carrier concentration. An undoped InAs guide layer (thickness: 75 nm) was then formed. Subsequently, active layers with a quantum well structure (total thickness: 830 nm) to have an emission center wavelength of 3200 nm were formed. Subsequently, a Zn-doped p-type $Al_{0.14}In_{0.86}As$ electron blocking layer (thickness: 15 nm), a Zn-doped p-type InAs cladding layer (thickness: 500 nm), and a C-doped p-type GaAs window layer (thickness: 1000 nm) were sequentially formed. The surface side of the p-type GaAs window layer was formed as a p-type contact region (thickness: 100 nm) having a high carrier concentration. The active layers of the quantum well structure had 20 layers of undoped $InAs_{0.92}P_{0.08}$ barrier layers (thickness: 30 nm) and 20 layers of $InAs_{0.95}Sb_{0.05}$ well layers (thickness: 10 nm) alternately laminated in sequence, and then an $InAs_{0.92}P_{0.08}$ barrier layer was grown to form 20.5 pairs including the final barrier layer. The lattice constant of the active layers is 0.6052. The lattice constant of the p-type $Al_{0.14}In_{0.86}$ As electron blocking layer is 0.5999 and the difference in lattice constant from the active layers is 0.9%. The lattice constant of the p-type InAs cladding layer is 0.6058 and the difference in lattice constant from the active layers is 0.1%.

Therefore, these layers are lattice-matched with each other. The above p-type $Al_{0.14}In_{0.86}As$ electron blocking layer and p-type InAs cladding layer are collectively referred to as the "p-type semiconductor layer that was lattice-matched with the active layer". On the other hand, the lattice constant of the p-type GaAs window layer is 0.5657, and the difference in lattice constant between the p-type semiconductor layer that is lattice-matched with the active layer (p-type InAs cladding layer as the layer in contact with the p-type GaAs window layer) and the p-type GaAs window layer is 6.6%. Therefore, these layers are lattice-mismatched with each other. If the layer in contact with the p-type GaAs window layer in the p-type semiconductor layer were the p-type $Al_{0.14}In_{0.86}As$ electron blocking layer, the difference in lattice constant between the p-type $Al_{0.14}In_{0.86}As$ electron blocking layer and the p-type GaAs window layer would be 5.7%. Therefore, these layers would not be lattice-matched with each other. Table 1 below lists the composition and thickness of each layer, as well as the types and concentrations of dopants (carrier concentration based on ECV measurements). The source gases selected for the formation of each layer were as follows: trimethylindium (TMIn) as the In source, trimethylgallium (TMGa) as the Ga source, trimethylaluminum (TMAl) as the Al source, arsine ($AsH_3$) as the As source, triethylanthimony (TESb) as the Sb source, and phosphine ($PH_3$) as the P source. In addition, carbon tetrabromide ($CBr_4$), DEZn (diethylzinc), and DETe (diethyl tellurium) were used as dopant gases.

An XRD apparatus JV-QC3 manufactured by BRUKER was used for measurements of the compositions of each layer. The compositions of each layer were calculated by fitting using analysis software (Jordan Valley RADS). The thickness of each layer was calculated by observing a cross-section of the grown layer by an SEM (scanning electron microscope) or a TEM (transmission electron microscope). Measurements of carrier concentration ($cm^{-3}$) by ECV measurements were conducted using the ECVpro-UV manufactured by Onto Innovation. An electrolyte was brought into contact with the semiconductor layer to create an electrochemical junction (Schottky junction). Measurements in the depth direction were performed by alternately repeating etching and capacitance measurements.

TABLE 1

| Semiconductor layer | | Composition | Thickness | Dopant | Carrier concentration $cm^{-3}$ |
|---|---|---|---|---|---|
| p-type InGaAs window layer | | p-GaAs | 100 nm | C | $1.0 \times 10^{19}$ |
| | | | 900 nm | C | $3.0 \times 10^{18}$ |
| p-type InAs cladding layer | | p-InAs | 500 nm | Zn | $3.0 \times 10^{18}$ |
| p-type AlInAs electron blocking layer | | p-$Al_{0.14}In_{0.86}As$ | 15 nm | Zn | $3.0 \times 10^{18}$ |
| InAsSbP active layer | Barrier layer | i-$InAs_{0.92}P_{0.08}$ | 30 nm | none | — |
| (MQW active layer) | Well layer | i-$InAs_{0.95}Sb_{0.05}$ | 10 nm | none | — |
| | Barrier layer | i-$InAs_{0.92}P_{0.08}$ | 30 nm | none | — |
| | Well layer | i-$InAs_{0.95}Sb_{0.05}$ | 10 nm | none | — |
| | | | . | | |
| | | | . | | |
| | | | . | | |
| | | | . | | |
| | | | . | | |
| | Barrier layer | i-$InAs_{0.92}P_{0.08}$ | 30 nm | none | — |
| | Well layer | i-$InAs_{0.95}Sb_{0.05}$ | 10 nm | none | — |
| | Barrier layer | i-$InAs_{0.92}P_{0.08}$ | 30 nm | none | — |
| n-side guide layer | | i-InAs | 75 nm | none | — |
| n-type semiconductor layer | | n-InAs | 4.9 μm | Te | $-5.0 \times 10^{18}$ |
| | | | 0.3 μm | Te | $-2.0 \times 10^{19}$ |
| Substrate | | n-GaAs | 350 μm | Si | $-1.0 \times 10^{18}$ |

(barrier layer + well layer) × 20 layers

Subsequently, a transparent insulating layer (thickness: 550 nm) made of $SiO_2$ was formed on the entire surface of the p-type GaAs window layer by plasma CVD. A pattern of the power distribution area was formed on the transparent insulating layer from a resist. $SiO_2$ in the area not covered by the resist was removed by etching to expose the C-doped p-type GaAs window layer. Subsequently, Ti (thickness: 10 nm) and Au (thickness: 530 nm) were deposited as the ohmic metal portion using the vapor deposition. The resist in the pattern of the power distribution portion was removed together with the metal deposited thereon, so that only the ohmic metal portion formed on the exposed C-doped p-type GaAs window layer remained, thereby forming the power distribution portion in which the ohmic metal portion and the transparent insulating layer were arranged in parallel. A metal reflective layer (Al (thickness: 10 nm/Au (thickness: 650 nm)/Pt (thickness: 100 nm/Au (thickness: 900 nm)) was then formed on the power distribution portion by vapor deposition.

Subsequently, a metal bonding layer (Ti (thickness: 650 nm)/Pt (thickness: 20 nm)/Au (thickness: 900 nm)) was then formed on the support substrate (Si substrate) by vapor deposition. The metal reflective layer and the metal bonding layer were then placed to face each other and were subjected to thermocompression bonding at 300° C. The growth substrate was then removed by wet etching using an ammonia-hydrogen peroxide mixture to expose the n-type semiconductor layer. Subsequently, Ti (thickness: 150 nm)/Au (thickness: 1250 nm) were formed on the n-type semiconductor layer by vapor deposition to form an n-type ohmic electrode. A pad electrode (Ti (thickness: 150 nm)/Pt (thickness: 100 nm)/Au (thickness: 2500 nm)) was formed on the n-type ohmic electrode by vapor deposition, thereby forming a top electrode as the combination of the n-type ohmic electrode and the pad electrode. Note that a lift-off method using a resist was used for patterning of the electrode.

Subsequently, the semiconductor laminate between elements was removed (width: 60 μm) by mesa etching to form dicing lines. Then, a back electrode (Ti (thickness: 10 nm)/Pt (thickness: 50 nm)/Au (thickness: 200 nm)) was formed on the back surface of the support substrate by vapor deposition and alloyed by heat treatment at 300° C. for 1 minute. Subsequently, the entire wafer was immersed in a nitric acid solution kept at 8° C.±1° C. for 5 seconds to roughen the surface of the semiconductor laminate except for the area where the top electrode was formed. Then, after immersion in ammonia water for 1 minute, rinsing with deionized water was performed for 1 minute. Finally, chip singulation was performed by dicing to fabricate a semiconductor light-emitting element according to Example 1. Note that the chip size was 500 μm×500 μm. The thickness of each layer in the resulting light-emitting element is summarized in Table 1, among which the thicknesses of the p-type $Al_{0.14}In_{0.86}As$ electron blocking layer, the p-type InAs cladding layer, and the p-type GaAs window layer are denoted as T1, T2, and T3, respectively.

Example 2

A light-emitting element according to Example 2 was obtained in the same manner as in Example 1, except that the thickness of the p-type InAs cladding layer was changed from 500 nm to 30 nm and the thickness of the p-type semiconductor layer that was lattice-matched with the active layer was 45 nm.

Example 3

A light-emitting element according to Example 3 was obtained in the same manner as in Example 1, except that the thickness of the p-type InAs cladding layer was changed from 500 nm to 0 nm and the thickness of the p-type AlInAs electron blocking layer was set to 45 nm to thereby set the thickness of the p-type semiconductor layer that was lattice-matched with the active layer to 45 nm.

Example 4

A light-emitting element according to Example 4 was obtained in the same manner as in Example 1, except that the thickness of the p-type InAs cladding layer was changed from 500 nm to 0 nm and the thickness of the p-type AlInAs electron blocking layer was set to 30 nm to thereby set the thickness of the p-type semiconductor layer that was lattice-matched with the active layer to 30 nm.

Comparative Example 1

A light-emitting element according to Comparative Example 1 was obtained in the same manner as in Example 1, except that the thickness of the p-type InAs cladding layer was changed from 500 nm to 1000 nm and the thickness of the p-type semiconductor layer that was lattice-matched with the active layer was 1015 nm.

Comparative Example 2

A light-emitting element according to Comparative Example 2 was obtained in the same manner as in Example 1, except that the thickness of the p-type InAs cladding layer was changed from 500 nm to 0 nm and the thickness of the p-type semiconductor layer that was lattice-matched with the active layer was 15 nm.

Comparative Example 3

A light-emitting element according to Comparative Example 3 was obtained in the same manner as in Example 1, except that the thickness of the p-type InAs cladding layer was changed from 500 nm to 1000 nm thereby setting the thickness of the p-type semiconductor layer that was lattice-matched with the active layer to 1015 nm and the thickness of the p-type GaAs window layer was set to 0 nm.

Comparative Example 4

A light-emitting element according to Comparative Example 4 was obtained in the same manner as in Example 1, except that the thickness of the p-type GaAs window layer was changed from 1000 nm to 0 nm.

Comparative Example 5

A light-emitting element according to Comparative Example 5 was obtained in the same manner as in Example 1, except that the thickness of the p-type InAs cladding layer was changed from 500 nm to 30 nm to thereby set the thickness of the p-type semiconductor layer that was lattice-matched with the active layer to 45 nm and the thickness of the p-type GaAs window layer was 0 nm.

Comparative Example 6

A light-emitting element according to Comparative Example 6 was obtained in the same manner as in Example 1, except that the thickness of the p-type semiconductor layer except for the p-type GaAs window layer was set to 0 nm and an undoped InAs layer in 30 nm was formed instead of the p-type semiconductor layer.

<Evaluation: Evaluation of Emission Output Power>

A current of 300 mA was applied to the semiconductor light-emitting elements obtained in the above examples and comparative examples using a constant-current voltage power supply. The forward voltage Vf (V) and the emission output power Po (W) using an integrating sphere at this time were measured. The results are summarized in Table 2. The value of light emission efficiency WPE (%) is calculated by dividing the emission output power (W) by the applied power (forward voltage (V)×current 0.3 (A)).

The above results indicate the light emitted from the InAsSbP active layer was not absorbed but was extracted from the sides of the p-type GaAs window layer or the n-type semiconductor layers, leading to an increase in emission output power, in Examples 1 to 4 that satisfied the conditions of the present disclosure, by providing the p-type semiconductor layer that was lattice-matched with the InAsSbP active layer and had an optimal thickness and using the p-type GaAs window layer that was lattice-mismatched with the p-type semiconductor layer thereon.

In the present examples using a p-type GaAs window layer, the hole supply layer and the p-type GaAs window

TABLE 2

| InAsSbP active layer Well layer Composition | p-type semiconductor layer | | | | | |
|---|---|---|---|---|---|---|
| | p-type AlInAs electron blocking layer | | p-type InAs cladding layer | | Thickness: $T_1 + T_2$ nm |
| | Composition | Thickness: $T_1$ nm | Composition | Thickness: $T_2$ nm | |
| Example 1 | i-InAs$_{0.95}$Sb$_{0.05}$ | Zn—Al$_{0.14}$In$_{0.86}$As | 15 | Zn—InAs | 500 | 515 |
| Example 2 | i-InAs$_{0.95}$Sb$_{0.05}$ | Zn—Al$_{0.14}$In$_{0.86}$As | 15 | Zn—InAs | 30 | 45 |
| Example 3 | i-InAs$_{0.95}$Sb$_{0.05}$ | Zn—Al$_{0.14}$In$_{0.86}$As | 45 | none | 0 | 45 |
| Example 4 | i-InAs$_{0.95}$Sb$_{0.05}$ | Zn—Al$_{0.14}$In$_{0.86}$As | 30 | none | 0 | 30 |
| Comp. Ex. 1 | i-InAs$_{0.95}$Sb$_{0.05}$ | Zn—Al$_{0.14}$In$_{0.86}$As | 15 | Zn—InAs | 1000 | 1015 |
| Comp. Ex. 2 | i-InAs$_{0.95}$Sb$_{0.05}$ | Zn—Al$_{0.14}$In$_{0.86}$As | 15 | none | 0 | 15 |
| Comp. Ex. 3 | i-InAs$_{0.95}$Sb$_{0.05}$ | Zn—Al$_{0.14}$In$_{0.86}$As | 15 | Zn—InAs | 1000 | 1015 |
| Comp. Ex. 4 | i-InAs$_{0.95}$Sb$_{0.05}$ | Zn—Al$_{0.14}$In$_{0.86}$As | 15 | Zn—InAs | 500 | 515 |
| Comp. Ex. 5 | i-InAs$_{0.95}$Sb$_{0.05}$ | Zn—Al$_{0.14}$In$_{0.86}$As | 15 | Zn—InAs | 30 | 45 |
| Comp. Ex. 6 | i-InAs$_{0.95}$Sb$_{0.05}$ | none (i-InAs) | 0 | none (i-InAs) | 0 | 0 |

| | p-type GaAs window layer | | p-type semiconductor layer + p-type GaAs window layer Thickness: $T_1 + T_2 + T_3$ nm | Evaluating of emission power output when 300 mA was applied | | |
|---|---|---|---|---|---|---|
| | | | | Emission output power Po W | Forward voltage Vf V | Light emission efficiency WPE % |
| | Composition | Thickness: $T_3$ nm | | | | |
| Example 1 | C—GaAs | 1000 | 1515 | 0.21 | 0.35 | 0.20 |
| Example 2 | C—GaAs | 1000 | 1045 | 0.44 | 0.37 | 0.40 |
| Example 3 | C—GaAs | 1000 | 1045 | 0.32 | 0.45 | 0.24 |
| Example 4 | C—GaAs | 1000 | 1030 | 0.37 | 0.49 | 0.25 |
| Comp. Ex. 1 | C—GaAs | 1000 | 2015 | 0.14 | 0.33 | 0.14 |
| Comp. Ex. 2 | C—GaAs | 1000 | 1015 | No emission | — | — |
| Comp. Ex. 3 | none | 0 | 1015 | 0.17 | 0.31 | 0.18 |
| Comp. Ex. 4 | none | 0 | 515 | 0.02 | 0.20 | 0.03 |
| Comp. Ex. 5 | none | 0 | 45 | No emission | — | — |
| Comp. Ex. 6 | C—GaAs | 1000 | 1000 | No emission | — | — | layer were lattice mismatched. The flow of holes was hindered by the lattice mismatch at the interface. As a result, the values of the forward voltage in the present examples significantly increased compared to the comparative examples 3 to 5 that have no p-type GaAs window layer. However, the values of the emission output power relative to the applied power (light emission efficiency) were higher. It is considered that the use of the p-type GaAs window layer increased the efficiency of extraction of light without being absorbed from the p-type GaAs window layer to the outside, the p-type GaAs window layer is 0.5657, and the difference in lattice constant between the layer in contact with the p-type GaAs window layer in the p-type semiconductor layer that was lattice-matched with the active layer (the p-type InAs cladding layer in the above-described case) and the p-type GaAs window layer is 6.6%. These layers are lattice-mismatched. Table 3 below lists the composition and thickness of each layer, as well as the types and concentrations of dopants (carrier concentration based on ECV measurements).

TABLE 3

| Semiconductor layer | | Composition | Thickness | Dopant | Carrier concentration $cm^{-3}$ | |
|---|---|---|---|---|---|---|
| p-type InGaAs window layer | | p-GaAs | 100 nm | C | $1.0 \times 10^{19}$ | |
| | | | 900 nm | C | $3.0 \times 10^{18}$ | |
| p-type InAs cladding layer | | p-InAs | 30 nm | Zn | $3.0 \times 10^{18}$ | |
| p-type AlInAs electron blocking layer | | p-$Al_{0.15}In_{0.85}As$ | 15 nm | Zn | $3.0 \times 10^{18}$ | |
| InAsSbP active layer | Barrier layer | i-$InAs_{0.88}P_{0.12}$ | 30 nm | none | — | |
| (MQW active layer) | Well layer | i-$InAs_{0.88}Sb_{0.12}$ | 10 nm | none | — | |
| | Barrier layer | i-$InAs_{0.88}P_{0.12}$ | 30 nm | none | — | |
| | Well layer | i-$InAs_{0.88}Sb_{0.12}$ | 10 nm | none | — | (barrier + well layer) × 20 layers |
| | Barrier layer | i-$InAs_{0.88}P_{0.12}$ | 30 nm | none | — | |
| | Well layer | i-$InAs_{0.88}Sb_{0.12}$ | 10 nm | none | — | |
| | Barrier layer | i-$InAs_{0.88}P_{0.12}$ | 30 nm | none | — | |
| n-side guide layer | | i-InAs | 75 nm | none | — | |
| n-type semiconductor layer | | n-InAs | 4.9 μm | Te | $-5.0 \times 10^{18}$ | |
| | | | 0.3 μm | Te | $-2.0 \times 10^{19}$ | |
| Substrate | | n-GaAs | 350 μm | Si | $-1.0 \times 10^{18}$ | | resulting in an increase in emission output power that exceeds the contribution by the increase in forward voltage.

Experimental Example 2

Tests were conducted by changing the target emission center wavelength from 3200 nm to 3800 nm and changing the composition of the active layers.

Example 5

A light-emitting element according to Example 5 was obtained in the same manner as in Example 1, except that the Sb solid phase ratio in the well layers of the active layers was changed from 0.05 to 0.12, the P solid phase ratio in the barrier layers was changed from 0.08 to 0.12, the Al solid phase ratio in the p-type AlInAs electron blocking layer was changed from 0.14 to 0.15, the thickness of the p-type InAs cladding layer was changed from 500 nm to 30 nm to thereby set the thickness of the P-type semiconductor layer excluding the p-type GaAs window layer to 45 nm. The lattice constant of the active layers is 0.6054. The lattice constant of the p-type $Al_{0.15}In_{0.85}As$ electron blocking layer is 0.5999 and the difference in lattice constant from the active layers is 0.9%. The lattice constant of the p-type InAs cladding layer is 0.6058 and the difference in lattice constant from the active layers is 0.1%. These layers are lattice-matched. The above p-type $Al_{0.15}In_{0.85}As$ electron blocking layer and p-type InAs cladding layer are collectively referred to as the p-type semiconductor layer that was lattice-matched with the active layer. The lattice constant of

Comparative Example 7

A light-emitting element according to Comparative Example 7 was obtained in the same manner as in Example 5, except that the thickness of the p-type semiconductor layer except for the p-type GaAs window layer was set to 0 nm and an undoped InAs layer in 30 nm was formed instead of the p-type semiconductor layer.

Comparative Example 8

A light-emitting element according to Comparative Example 8 was obtained in the same manner as in Example 5, except that the thickness of the p-type InAs cladding layer was changed from 30 nm to 1000 nm to thereby set the thickness of the p-type semiconductor layer excluding the p-type GaAs window layer to 1015 nm and the thickness of the p-type GaAs window layer was set to 0 nm.

<Evaluation: Evaluation of Emission Output Power>

Similarly to Experimental Example 1, a current of 300 mA was applied to the semiconductor light-emitting element using a constant-current voltage power supply, and the forward voltage Vf (V) and the emission output power Po (mW) using an integrating sphere were measured. The measurement results for Example 5 and Comparative Examples 7 and 8 are summarized in Table 4.

TABLE 4

| | InAsSbP active layer Well layer Composition | p-type AlInAs electron blocking layer Composition | Thickness: $T_1$ nm | p-type InAs cladding layer Composition | Thickness: $T_2$ nm | Thickness: $T_1 + T_2$ nm |
|---|---|---|---|---|---|---|
| Example 5 | $i$-InAs$_{0.88}$Sb$_{0.12}$ | Zn—Al$_{0.15}$In$_{0.85}$As | 15 | Zn—InAs | 30 | 45 |
| Comp. Ex. 7 | $i$-InAs$_{0.88}$Sb$_{0.12}$ | none ($i$-InAs) | 0 | none ($i$-InAs) | 0 | 0 |
| Comp. Ex. 8 | $i$-InAs$_{0.88}$Sb$_{0.12}$ | Zn—Al$_{0.15}$In$_{0.85}$As | 15 | Zn—InAs | 1000 | 1015 |

| | p-type GaAs window layer Composition | Thickness: $T_3$ nm | p-type semiconductor layer + p-type GaAs window layer Thickness: $T_1 + T_2 + T_3$ nm | Evaluating of emission power output when 300 mA was applied — Emission output power Po W | Forward voltage Vf V | Light emission efficiency WPE % |
|---|---|---|---|---|---|---|
| Example 5 | C—GaAs | 1000 | 1045 | 0.43 | 0.36 | 0.40 |
| Comp. Ex. 7 | C—GaAs | 1000 | 1000 | No emission | 0.11 | — |
| Comp. Ex. 8 | none | 0 | 1015 | 0.30 | 0.29 | 0.34 |

From the above results, it was confirmed that the emission output power and the light emission efficiency can be increased by providing the p-type semiconductor layer that was lattice-matched with the active layer and had an optimal thickness and using the p-type GaAs window layer that was lattice-mismatched with the p-type semiconductor layer thereon. In this manner, a light-emitting element with high emission output power and light emission efficiency and a method of manufacturing the same can be provided.

INDUSTRIAL APPLICABILITY

According to the present disclosure, it is possible to provide a method of manufacturing a semiconductor optical device that includes an InAsSbP semiconductor layer containing at least In and As and that has improved optical device characteristics of the semiconductor optical device. Furthermore, the present disclosure is applicable to a method of manufacturing a semiconductor laminate and a semiconductor laminate.

DESCRIPTION OF REFERENCE SYMBOLS

100 Light-emitting element
105 Growth substrate
140 Semiconductor laminate
141 n-type semiconductor layer
145 InAsSbP active layer
145$w$ In As$_y$Sb$_{1-y}$ layer
145$b$ InAs$_z$P$_{1-z}$ layer
146 p-type AlInAs electron blocking layer
147 Cladding layer
148 p-type semiconductor layer
150 p-type InGaAs window layer
191 Top electrode
195 Back electrode 260 Power distribution portion
261 Transparent insulating layer
265 Ohmic metal portion
271 Metal reflective layer
279 Metal bonding layer
280 Support substrate

The invention claimed is:

1. A light-emitting element comprising:
an n-type semiconductor layer;
an InAsSbP active layer containing at least In and As on the n-type semiconductor layer;
a p-type semiconductor layer that is lattice-matched with the InAsSbP active layer, on the InAsSbP active layer; and
a p-type InGaAs window layer that is lattice-mismatched with the p-type semiconductor layer, on the p-type semiconductor layer,
wherein the p-type semiconductor layer has a thickness of 20 nm or more and 520 nm or less.

2. The light-emitting element according to claim 1, wherein the InAsSbP active layer has a quantum well structure and an average lattice constant of the quantum well structure is 0.5988 or more and 0.6153 or less.

3. The light-emitting element according to claim 1, wherein the p-type semiconductor layer has a p-type AlInAs electron blocking layer, and
the p-type AlInAs electron blocking layer has a thickness of 5 nm or more and 60 nm or less and is made of Al$_x$In$_{1-x}$As ($0.05 \leq x \leq 0.4$).

4. The light-emitting element according to claim 3, wherein the p-type semiconductor layer has the p-type AlInAs electron blocking layer on an InAsSbP active layer side and a p-type InAs cladding layer on a side opposite to the InAsSbP active layer.

5. The light-emitting element according to claim 1, wherein the p-type InGaAs window layer is made of $In_w Ga_{1-w}As$ ($0 \leq w \leq 0.2$).

6. A method of manufacturing a light-emitting element, comprising:

forming an n-type semiconductor layer on a growth substrate;

forming an InAsSbP active layer containing at least In and As on the n-type semiconductor layer;

forming a p-type semiconductor layer that is lattice-matched with the InAsSbP active layer, on the InAsSbP active layer; and forming a p-type InGaAs window layer that is lattice-mismatched with the p-type semiconductor layer, on the p-type semiconductor layer, wherein the p-type semiconductor layer is formed to a thickness of 20 nm or more and 520 nm or less.

7. The method of manufacturing a light-emitting element according to claim 6, wherein the p-type semiconductor layer has a p-type AlInAs electron blocking layer, and the p-type AlInAs electron blocking layer is made of p-type $Al_x In_{1-x}As$ ($0.05 \leq x \leq 0.4$) with a thickness of 5 nm or more and 60 nm or less.

\* \* \* \* \*